(12) United States Patent
Lee

(10) Patent No.: US 9,396,805 B2
(45) Date of Patent: Jul. 19, 2016

(54) NONVOLATILE MEMORY SYSTEM WITH IMPROVED SIGNAL TRANSMISSION AND RECEPTION CHARACTERISTICS AND METHOD OF OPERATING THE SAME

(71) Applicant: SAMSUNG ELECTRONICS CO., LTD., Suwon-Si, Gyeonggi-Do (KR)

(72) Inventor: Jung-Pil Lee, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/711,643

(22) Filed: May 13, 2015

(65) Prior Publication Data

US 2015/0332781 A1    Nov. 19, 2015

(30) Foreign Application Priority Data

May 19, 2014 (KR) .................. 10-2014-0059968

(51) Int. Cl.
*G11C 16/04* (2006.01)
*G11C 16/32* (2006.01)
*G11C 16/10* (2006.01)

(52) U.S. Cl.
CPC ............... *G11C 16/32* (2013.01); *G11C 16/10* (2013.01)

(58) Field of Classification Search
CPC ................................. G11C 16/32; G11C 16/10
USPC .............. 365/185.18, 191, 193, 198, 233.1, 365/233.5
See application file for complete search history.

(56) References Cited

U.S. PATENT DOCUMENTS

| | | | |
|---|---|---|---|
| 6,564,284 B2 | 5/2003 | Christenson | |
| 6,640,274 B1 | 10/2003 | Huffman et al. | |
| 7,196,948 B1 * | 3/2007 | Vemula | G11C 7/1051 365/189.15 |
| 7,444,535 B2 | 10/2008 | Hsieh et al. | |
| 7,490,283 B2 | 2/2009 | Gorobets et al. | |
| 7,562,181 B2 | 7/2009 | Sinclair et al. | |
| 8,037,234 B2 | 10/2011 | Yu et al. | |
| 8,296,480 B2 | 10/2012 | Noeldner et al. | |
| 8,312,241 B2 | 11/2012 | Wang et al. | |
| 8,341,332 B2 | 12/2012 | Ma et al. | |
| 8,380,909 B2 | 2/2013 | Borchers et al. | |
| 8,473,811 B2 | 6/2013 | Jo et al. | |
| 8,543,758 B2 | 9/2013 | Larson et al. | |
| 9,053,811 B2 * | 6/2015 | Coteus | G11C 11/40611 |
| 2005/0286330 A1 * | 12/2005 | Ito | G11C 11/406 365/222 |
| 2009/0074408 A1 | 3/2009 | Black et al. | |
| 2010/0049909 A1 | 2/2010 | Lasser | |
| 2010/0262979 A1 * | 10/2010 | Borchers | G06F 9/544 719/321 |

(Continued)

FOREIGN PATENT DOCUMENTS

WO    WO2012164986 A2    12/2012

OTHER PUBLICATIONS

Chung, Yuping, "Design Considerations of UFS & e.MMC Controllers," JEDEC Mobile Forum May 2013.

(Continued)

*Primary Examiner* — Tha-O H Bui
(74) *Attorney, Agent, or Firm* — Volentine & Whitt, PLLC

(57) ABSTRACT

A non-volatile memory system and a method of operating a non-volatile memory system are provided. The method includes receiving a command from a host, generating a strobe signal using a clock signal, generating a command response synchronized with the strobe signal and corresponding to the received command and outputting the strobe signal and the command response.

20 Claims, 18 Drawing Sheets

(56) References Cited

U.S. PATENT DOCUMENTS

| | | |
|---|---|---|
| 2011/0093753 A1 | 4/2011 | Takagi |
| 2011/0138114 A1 | 6/2011 | Yen |
| 2011/0264851 A1 | 10/2011 | Jeon et al. |
| 2012/0120741 A1 | 5/2012 | Kim et al. |
| 2012/0311193 A1 | 12/2012 | Erdmann et al. |
| 2012/0311197 A1 | 12/2012 | Larson et al. |
| 2013/0064025 A1 | 3/2013 | Chen et al. |
| 2013/0121341 A1 | 5/2013 | Agrawal et al. |
| 2013/0159608 A1* | 6/2013 | Shin .................. G06F 3/0607 711/103 |
| 2013/0262744 A1 | 10/2013 | Ramachandra et al. |
| 2013/0265835 A1 | 10/2013 | Lee |

OTHER PUBLICATIONS

Haines, Andrew, "Design Considerations for UFS & eMMC Controllers," Flash Memory Summit.

* cited by examiner

NONVOLATILE MEMORY SYSTEM WITH IMPROVED SIGNAL TRANSMISSION AND RECEPTION CHARACTERISTICS AND METHOD OF OPERATING THE SAME

CROSS-REFERENCE TO RELATED APPLICATION

A claim for priority under 35 U.S.C. §119 is made to Korean Patent Application No. 10-2014-0059968, filed on May 19, 2014, in the Korean Intellectual Property Office, the entire contents of which are hereby incorporated by reference.

BACKGROUND

The inventive concept relates to a non-volatile memory system and a host, and more particularly, to a non-volatile memory system and a host with improved signal transmission and reception characteristics, and a method of operating the non-volatile memory system and the host.

Devices that maintain stored data even without the power supply are referred to as non-volatile memories. Examples of non-volatile memories include read only memory (ROM), a magnetic disk, an optical disk, flash memory, resistive random access memory (RRAM), phase-change RAM (PRAM), and magneto-resistive RAM (MRAM). Flash memory, in particular, stores data in accordance with changes in threshold voltage of a metal oxide semiconductor (MOS) transistor. Examples include NAND flash memory and NOR flash memory.

A non-volatile memory system includes a memory controller for controlling reading and erasing of data from a memory cell array in a non-volatile memory device. In addition, the non-volatile memory system may be implemented by a memory card and mounted in a mobile device to communicate with a host implemented by an application processor (AP). It is desirable to improve signal transmission and reception characteristics between the host and the non-volatile memory system.

SUMMARY

Embodiments of the inventive concept provide a non-volatile memory system and a host with improved signal transmission and reception speed and accuracy, and a method of operating the non-volatile memory system and the host with improved signal transmission and reception speed and accuracy.

According to an aspect of the inventive concept, there is provided a method of operating a non-volatile memory system. The method includes receiving a command, generating a strobe signal using a clock signal, generating a command response synchronized with the strobe signal and corresponding to the received command, and outputting the strobe signal and the command response.

A first period during which the command response is output may be set, and the strobe signal may be activated in the first period.

The command response may be synchronized with the strobe signal in accordance with a skew value defined based on a first edge of the strobe signal. Alternatively, the command response may be synchronized with the strobe signal in accordance with a setup time and a hold time defined based on a second edge of the strobe signal.

The strobe signal may have a period equal to a period of the clock signal, and the command response may be output in synchronization with a first edge of the strobe signal. The strobe signal may have a period equal to a period of the clock signal, and the command response may be output in synchronization with first and second edges of the strobe signal.

The clock signal may be provided from an external host. The clock signal may be a data strobe signal generated by the non-volatile memory system when data is output, and is provided externally from the non-volatile memory system together with the data.

According to another aspect of the inventive concept, there is provided a method of operating a host. The method includes outputting a clock signal and a command, receiving a command response corresponding to the command and a strobe signal in synchronization with the command response, generating an internal strobe signal by performing at least one of delay and phase control operations on the strobe signal, and storing the command response using the internal strobe signal as a clock source.

A tuning process of determining a sampling point for latching the command response is omitted.

The command response may be received in response to rising and falling edges of the strobe signal. The strobe signal may be delayed to generate the internal strobe signal when the command response is stored at a rising edge of the strobe signal, and a phase of the strobe signal may be inverted to generate the internal strobe signal when the command response is stored at a falling edge of the strobe signal.

The host may be an application processor provided in a mobile device.

According to another aspect of the inventive concept, there is provided a non-volatile memory system including a memory controller and a non-volatile memory device. The memory controller is configured to receive a command and a clock signal related to a memory operation request from a host, to generate a strobe signal using the received clock signal, to generate a command response corresponding to the received command and synchronized with the strobe signal, to generate an internal command and an internal clock signal using the received command and clock signal, and to provide at least the command response and the strobe signal to the host. The non-volatile memory device is configured to receive the internal command and the internal clock signal generated by the memory controller, and to store write data in a memory cell array or provide read data to the memory controller, in response to the internal command.

The memory controller may include a control unit configured to control operations related to at least one of writing data in the non-volatile memory device and reading data from the non-volatile memory device in response to the memory operation request from the host; a clock signal receiving unit configured to receive the clock signal from the host and to generate the internal clock signal; a command transmitting and receiving unit configured to receive the command from the host and to generate the command response corresponding to the command; and a strobe signal generator configured to generate the strobe signal with which the command response is synchronized while the command response is output to the host.

The command response may represent to the host at least one of whether the command is normally received by the memory controller or whether a memory operation corresponding to the memory operation request is normally performed in response to the command.

The non-volatile memory system may include a flash memory or a memory card.

The command response may be synchronized with the strobe signal in accordance with a setup time and a hold time defined based on an edge of the strobe signal. The strobe signal may have a period equal to a period of the clock signal, and the command response may be output in synchronization with one of a first edge and a second edge of the strobe signal.

BRIEF DESCRIPTION OF THE DRAWINGS

Exemplary embodiments of the inventive concept will be more clearly understood from the following detailed description taken in conjunction with the accompanying drawings, in which.

DETAILED DESCRIPTION OF THE EMBODIMENTS

Figure 1:
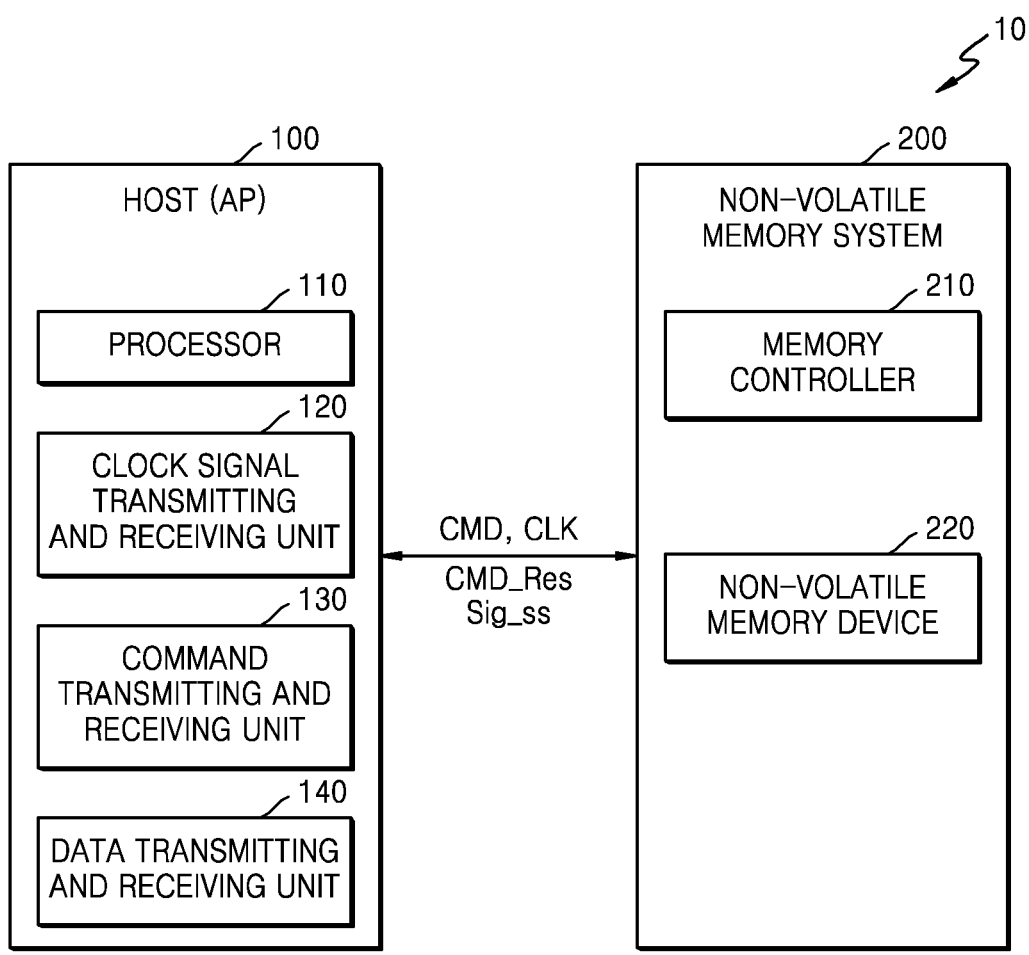
FIG. 1 is a block diagram of a data processing system, according to an embodiment of the inventive concept.

Embodiments will be described more fully with reference to the following description and accompanying drawings, in which exemplary embodiments of the inventive concept are shown. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to one of ordinary skill in the art. Accordingly, known processes, elements, and techniques are not described with respect to some of the embodiments. Unless otherwise noted, like reference numerals denote like elements throughout the attached drawings and written description, and thus descriptions may not be repeated. In the drawings, thicknesses and relative sizes of elements may be exaggerated for clarity.

Unless otherwise defined, terms such as "include" and "have" are for representing that characteristics, numbers, steps, operations, elements, and parts described in the specification or a combination of the above exist. It may be interpreted that one or more other characteristics, numbers, steps, operations, elements, and parts or a combination of the above may be added. The term "exemplary" is intended to refer to an example or illustration.

Unless otherwise defined, all terms (including technical and scientific terms) used herein have the same meaning as commonly understood by one of ordinary skill in the art to which this inventive concept belongs.

FIG. 1 is a block diagram of a data processing system, according to an embodiment of the inventive concept.

As illustrated in FIG. 1, data processing system 10 includes a host 100 and a non-volatile memory system 200. For example, the non-volatile memory system 200 may be an embedded multimedia card (eMMC), and the host 100 may correspond to a system-on-chip (SoC) type application processor (AP) mounted in a mobile device.

The host 100 includes a processor 110, a clock signal transmitting and receiving unit 120, a command transmitting and receiving unit 130, and a data transmitting and receiving unit 140. For example, the processor 110 may be a microprocessor or a central processing unit (CPU). The processor 110 is configured to execute command code stored in a memory (not shown) provided in the host 100 to control overall operation of the host 100. For example, the host 100 may control a memory operation so that data Data of the non-volatile memory system 200 may be accessed, and may control the clock signal transmitting and receiving unit 120, the command transmitting and receiving unit 130, and the data transmitting and receiving unit 140 to provide a command CMD and a clock signal CLK and/or write data to the non-volatile memory system 200, respectively.

The clock signal transmitting and receiving unit 120 generates a clock signal CLK, and provides the generated clock signal CLK to the non-volatile memory system 200. In addition, the command transmitting and receiving unit 130 provides a command CMD to the non-volatile memory system 200 and/or receives a command response CMD_Res from the non-volatile memory system 200. In addition, the data transmitting and receiving unit 140 provides write data to the non-volatile memory system 200 and/or receives read data from the non-volatile memory system 200. The non-volatile memory system 200 receives a command CMD and writes or reads data in response to a clock signal CLK.

The non-volatile memory system 200 includes a memory controller 210 and a non-volatile memory device 220. The memory controller 210 receives a command CMD and a clock signal CLK related to a memory operation from the host 100, generates an internal command and an internal clock signal using the received command CMD and clock signal CLK, and provides the generated internal command and internal clock signal to the non-volatile memory device 220. In response to the internal command, the non-volatile memory device 220 may store write data in memory cell array, or provide read data to the memory controller 210, depending on the internal command.

According to the embodiment of the inventive concept, the non-volatile memory system 200 generates a strobe signal Sig_ss in response to a command CMD from the host 100, generates a command response CMD_Res in synchronization with the strobe signal Sig_ss, and provides the generated command response CMD_Res and strobe signal Sig_ss to the host 100. The host 100 receives and stores the command response CMD_Res using the received strobe signal Sig_ss. The clock signal transmitting and receiving unit 120 in the host 100 generates a clock signal CLK as described above to output the generated clock signal CLK. The clock signal transmitting and receiving unit 120 receives the strobe signal Sig_ss from the non-volatile memory system 200, and latches the command response CMD_Res using the received strobe signal Sig_ss.

Since the host 100 reads the command response CMD_Res based on the strobe signal Sig_ss when receiving the command response CMD_Res, a valid window of the command response CMD_Res is secured so that the command response CMD_Res may be correctly recognized. In addition, since transmission speed of the command response CMD_Res may increase (for example, by transmitting the command response CMD_Res using a double data rate (DDR) method), overhead may be reduced during a period of the command response CMD_Res so that transmission speed of all data likewise increases.

Figure 2:
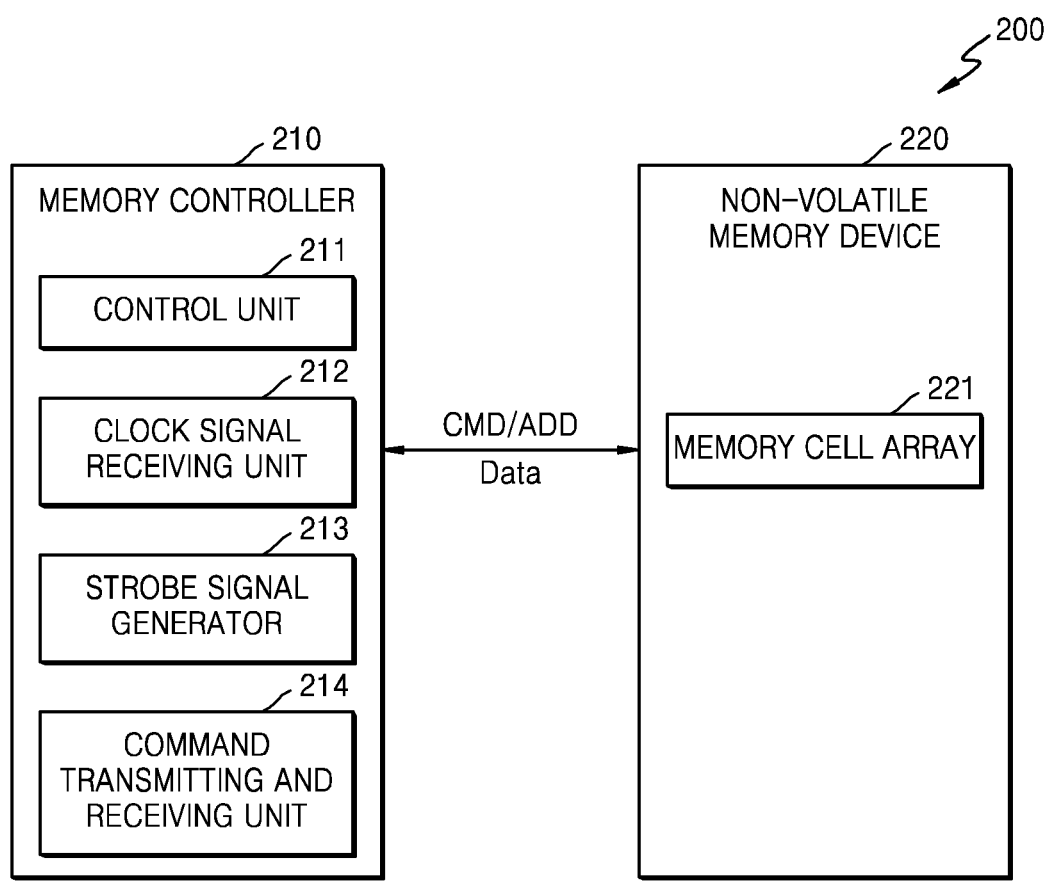
FIG. 2 is a block diagram of a non-volatile memory system, according to an embodiment of the inventive concept.

FIG. 2 is a block diagram of a non-volatile memory system, according to an embodiment of the inventive concept.

As illustrated in FIG. 2, the non-volatile memory system 200 includes memory controller 210 and non-volatile memory device 220. The memory controller 210 receives a memory operation request by communicating with the host 100, provides a command CMD and an address ADD corresponding to the memory operation request to the non-volatile memory device 220, and writes data Data in non-volatile memory device 220 and/or reads data Data from the non-volatile memory device 220 in response to the command CMD and the address ADD. The non-volatile memory device 220 includes a memory cell array 221 for storing the data Data.

The non-volatile memory device 220 maintains stored data even when power is stopped or interrupted. As such memory cells, the memory cell array 221 may in a NAND or NOR flash memory, magneto-resistive random access memory (MRAM), resistive RAM (RRAM), ferroelectric RAM (FRAM), or phase-change memory (PCM), for example. When the non-volatile memory device 220 is NAND flash memory, for example, the memory cell array 221 includes a plurality of blocks and pages, where data programming and reading may be performed in units of pages, and data erasing may be performed in units of blocks.

The memory controller 210 includes a control unit 211, a clock signal receiving unit 212, a strobe signal generator 213, and a command transmitting and receiving unit 214. The control unit 211 controls overall operation related to data writing and reading in and from the non-volatile memory device 220 in response to memory operation requests from the host 100. In addition, the clock signal receiving unit 212 receives the clock signal CLK from the host 100 and generates an internal clock signal used in the non-volatile memory system 200. In addition, the command transmitting and receiving unit 214 receives the command CMD from the host 100 and generates a command response CMD_Res corresponding to the command CMD to provide the generated command response CMD_Res to the host 100.

According to the embodiment of the inventive concept, the strobe signal generator 213 generates a strobe signal Sig_ss that is synchronized with the command response CMD_Res while the command response CMD_Res is output to the host 100. For example, when the command CMD related to the memory operation is received from the host 100, the command transmitting and receiving unit 214 generates a command response CMD_Res that represents whether the command CMD is normally received or whether the memory operation is normally performed in response to the command CMD, and the strobe signal generator 213 generates the strobe signal Sig_ss that is synchronized with the command response CMD_Res. The strobe signal Sig_ss may be activated in a period where the command response CMD_Res is provided and may be generated using the clock signal CLK provided by the host 100. As the command response CMD_Res and the strobe signal Sig_ss are provided to the host 100, the host 100 receives the command response CMD_Res in synchronization with the strobe signal Sig_ss and stores the received command response CMD_Res.

Figure 3:
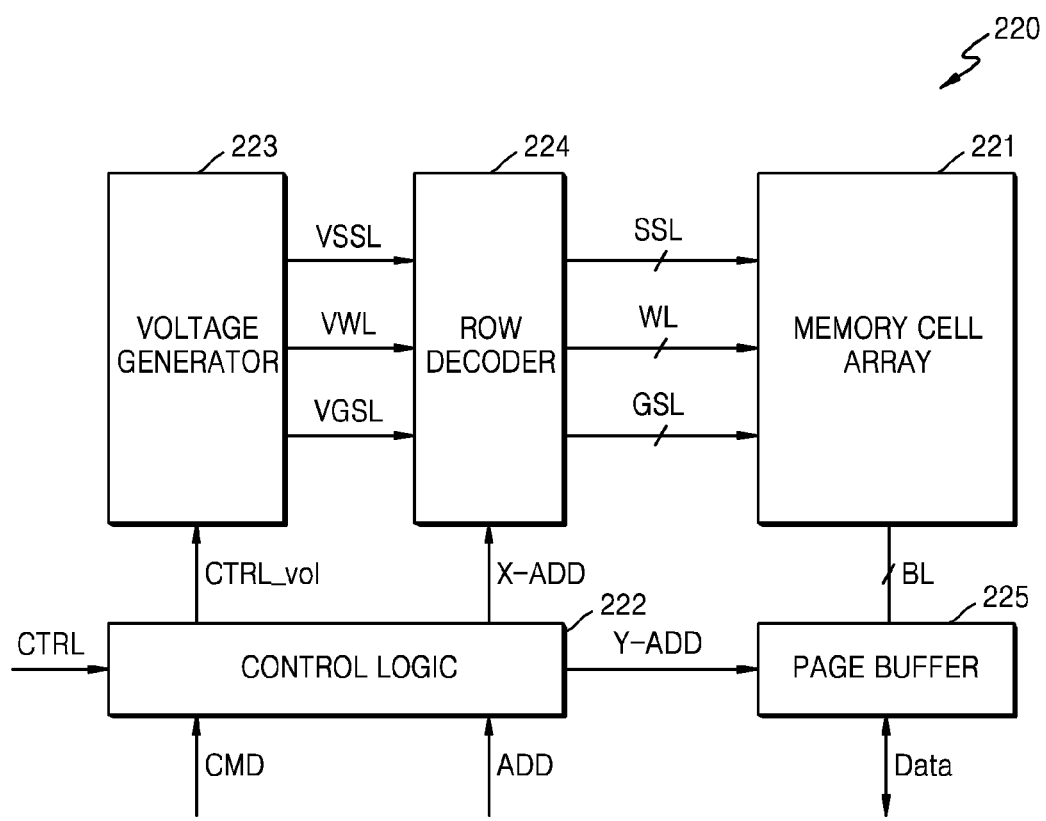
FIG. 3 is a block diagram of the non-volatile memory device of FIG. 2, according to an embodiment of the inventive concept.

FIG. 3 is a block diagram of the non-volatile memory device of FIG. 2, according to an embodiment of the inventive concept.

Referring to FIG. 3, the non-volatile memory device 220 includes the memory cell array 221, control logic 222, a voltage generator 223, a row decoder 224, and a page buffer 225. The memory cell array 221 is connected to at least one string selection line SSL, a plurality of word lines WL, at least one ground selection line GSL, and a plurality of bit lines BL. The memory cell array 221 may include memory cells arranged in regions where the plurality of word lines WL intersect the plurality of bit lines BL, respectively.

The control logic 222 receives a command CMD (e.g., the internal command generated by the memory controller 210) and an address ADD from the memory controller 210, and also receives a control signal CTRL for controlling various function blocks in the non-volatile memory device 220 from the memory controller 210. The control logic 222 outputs various control signals for writing or reading data Data in or from the memory cell array 221 based on the command CMD, the address ADD, and the control signal CTRL. Therefore, the control logic 222 may entirely control various operations in the non-volatile memory device 220.

The various control signals output by the control logic 222 may be provided to the voltage generator 223, the row decoder 224, and the page buffer 225. For example, the control logic 222 provides a voltage control signal CTRL_vol to the voltage generator 223, a row address X_ADD to the row decoder 224, and a column address Y_ADD to the page buffer 225.

The voltage generator 223 generates various kinds of voltages for programming the data Data in the memory cell array 221 and reading and erasing the data Data from the memory cell array 221 based on the voltage control signal CTRL_vol. For example, the voltage generator 223 may generate a first driving voltage VWL for driving the word lines WL, a second driving voltage VSSL for driving the string selection lines SSL, and a third driving voltage VGSL for driving the ground selection lines GSL. At this time, the first driving voltage VWL may be a program voltage (or a write voltage), a read voltage, an erase voltage, a pass voltage, or a program verify voltage. In addition, the second driving voltage VSSL may be a string selection voltage, that is, an on or off voltage. Furthermore, the third driving voltage VGSL may be a ground selection voltage, that is, an on or off voltage.

The row decoder 224 is connected to the memory cell array 221 through the word lines WL and may activate some of the word lines WL in response to the row address X_ADD received from the control logic 222. For example, during a read operation, the row decoder 224 may apply the read voltage to selected word lines and may apply the pass voltage to non-selected word lines. During a program operation, the row decoder 224 may apply the program voltage to the selected word lines and may apply the pass voltage to the non-selected word lines. According to the current embodiment, the row decoder 224 may apply the program voltage to the selected word lines and additionally selected word lines in at least one of program loops.

The page buffer 225 is connected to the memory cell array 221 through the bit lines BL. For example, during the read operation, the page buffer 225 may operate as a sense amplifier to output data Data stored in the memory cell array 221. During the program operation, the page buffer 225 may operate as a write driver to input data Data to be stored in the memory cell array 221.

The memory cells provided in the non-volatile memory device 220 may be implemented in various alternative forms, without departing from the scope of the present teachings. For example, the memory cell array 221 may include three-dimensional (or vertical) NAND (VNAND) memory cells. When the memory cell array 221 includes three-dimensional memory cells, the memory cell array 221 may include a plurality of memory blocks.

Figure 4:
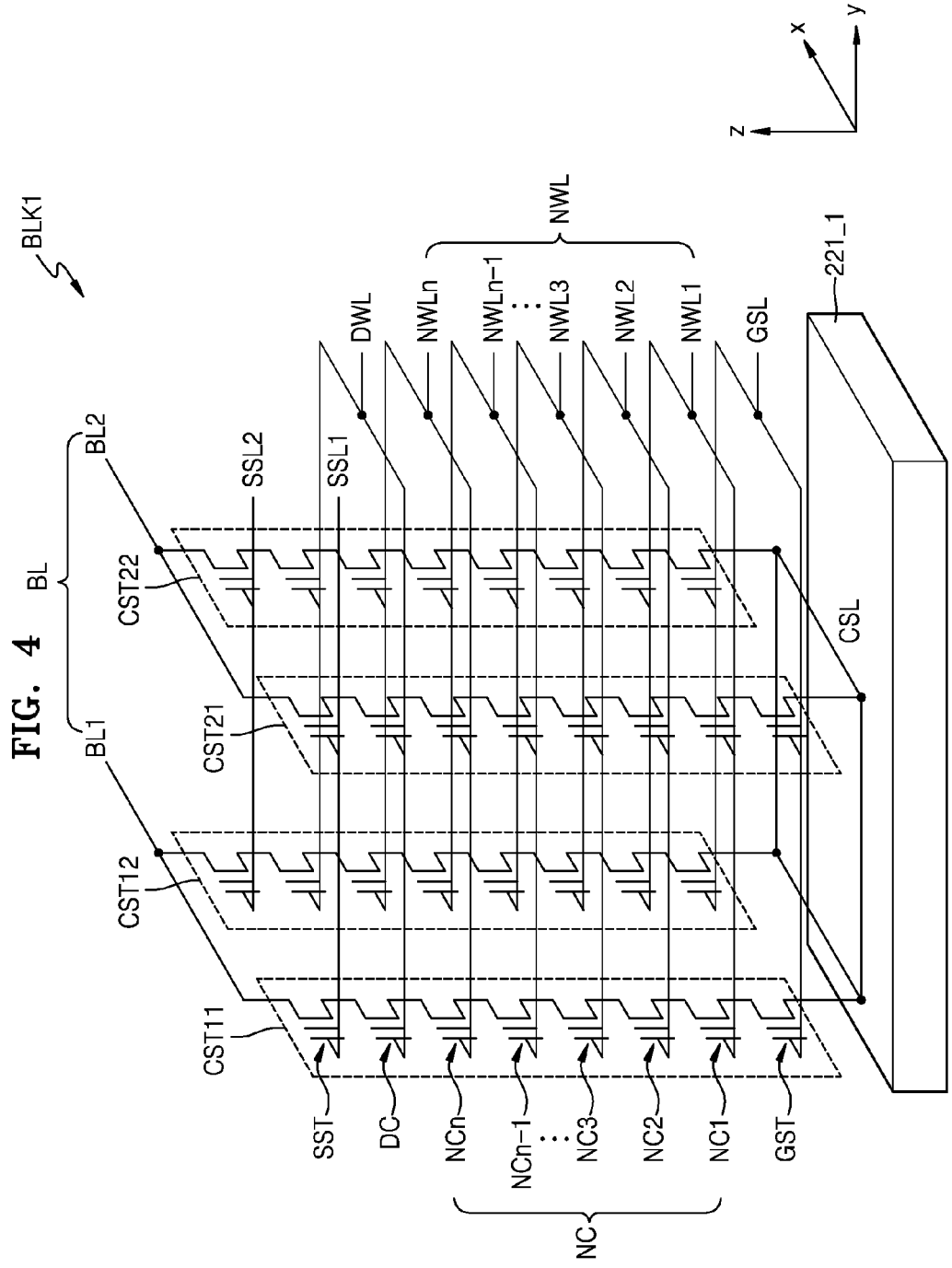
FIGS. 4 to 7 are diagrams illustrating examples in which the memory cell array of FIG. 3 includes three-dimensional memory cells, according to embodiments of the inventive concept.

FIG. 4 is a circuit diagram showing an example of one memory block (e.g., first memory block BLK1), according to an embodiment of the inventive concept.

Referring to FIG. 4, the first memory block BLK1 includes a substrate 221_1, a plurality of cell strings CST, a dummy word line DWL, a plurality of normal word lines NWL, a plurality of bit lines BL, a ground selection line GSL, and a common source line CSL. The number of cell strings CST, word lines WL, and bit lines BL provided in the first memory block BLK1 is described as being specific for the sake of convenience. However, embodiments of the inventive concept are not limited to the depicted configuration and various modifications may exist without departing from the scope of the present teachings. The number of normal cells provided in a cell string CST, described below, as an example.

The cell string CST is connected between a bit line BL and the common source line CSL. As described above, the cell string CST extends from the substrate 221_1 in a vertical direction Z. The cell string CST includes a string selection transistor SST, a dummy cell DC, a plurality of normal cells NC, and a ground selection transistor GST that are serially connected between the bit line BL and the common source line CSL. For example, a cell string CST11 may include a string selection transistor SST, a dummy cell DC, normal cells NC1 to NCn, and a ground selection transistor GST that are serially connected between a bit line BL1 and the common source line CSL.

The string selection transistor SST is connected to a string selection line SSL that extends in a column (Y) direction to be controlled, and the ground selection transistor GST is connected to the ground selection line GSL that extends in a row (X) direction and the column (Y) direction to be controlled. For example, the string selection transistor SST of the cell string CST11 may be connected to a string selection line SSL1 to be controlled and the string selection transistor SST of a cell string CST12 may be connected to a string selection line SSL2 to be controlled. Ground selection transistors GST of cell strings CST11, CST12, CST21, and CST22 may be connected to the shared ground selection line GSL to be controlled.

The dummy cell DC is connected to the dummy word line DWL that extends in the row (X) direction and the column (Y) direction to be controlled, and the normal cells NC are respectively connected to the normal word lines NWL that extend in the row (X) direction and the column (Y) direction to be controlled. For example, the dummy cells DC of the cell strings CST11, CST12, CST21, and CST22 may be connected to the shared dummy word line DWL to be controlled. The dummy cells DC may be respectively provided to improve operation characteristics of the cell strings CST. For example, the dummy cells DC may be used to reduce influences deteriorating string selection transistors SST of the cell strings CST have on the cell strings CST or to prevent the cell strings CST from deteriorating due to a difference between a voltage applied to the string selection transistors SST and a voltage applied to the normal cells NC during operations of the cell strings CST for the normal cells NC.

Data is written in the normal cells NC1 to NCn. The normal cells NC1 to NCn of the cell strings CST11, CST12, CST21, and CST22 may be respectively connected to the shared normal word lines NWL to be controlled.

The bit lines BL are connected to the cell strings CST arranged in the row (X) direction. For example, the cell string CST11 and the cell string CST12 may be connected to the bit line BL1 and the cell string CST21 and the cell string CST22 may be connected to a bit line BL2.

Figure 5:
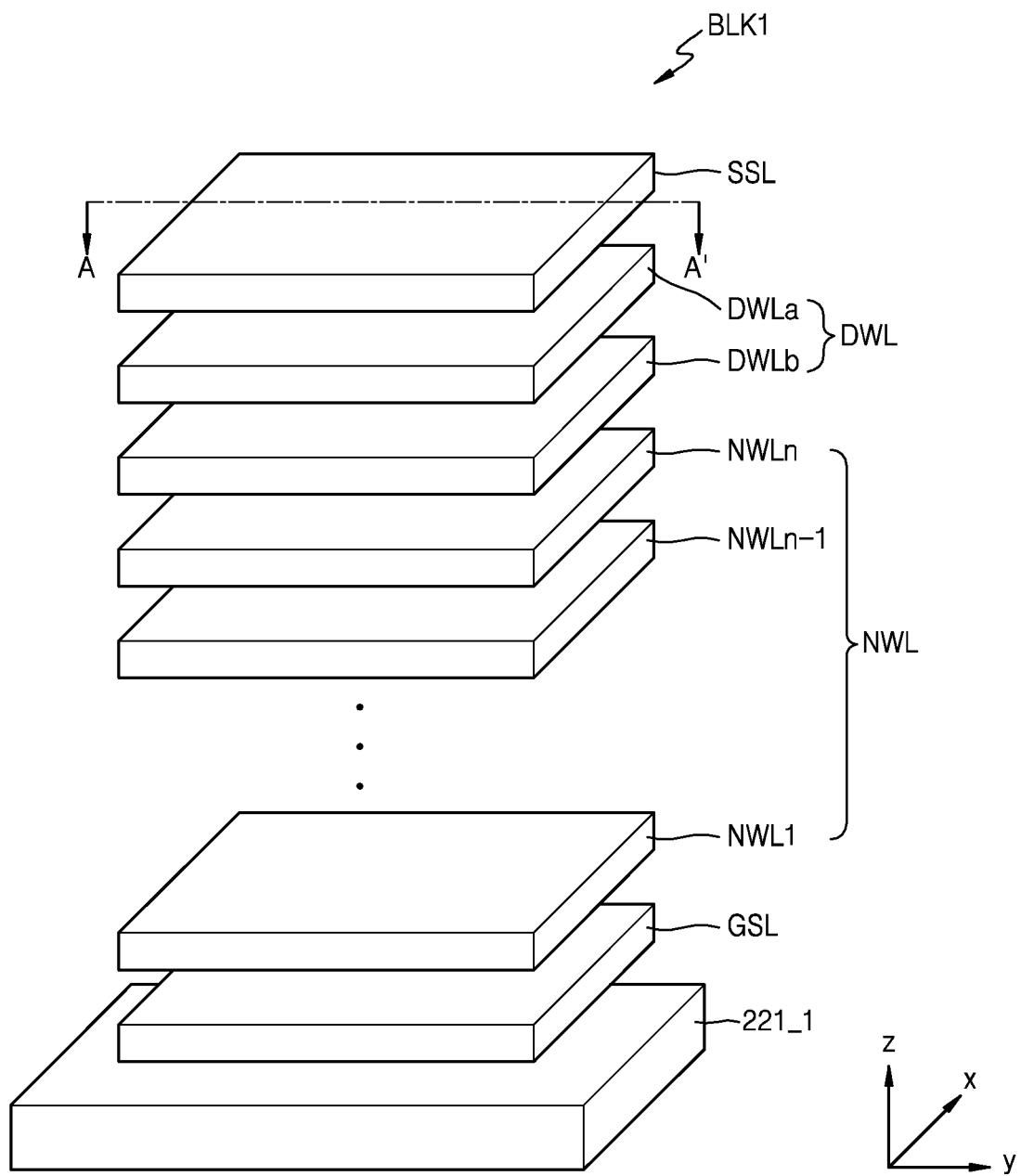

In FIG. 4, each cell string CST is illustrated as including only one dummy cell DC. However, embodiments of the inventive concept are not limited thereto. Referring to FIG. 5 that illustrates another example of the first memory block BLK1, layers stacked from the substrate 221_1 in the vertical direction Z are illustrated as a string selection line SSL, dummy word lines DWL, normal word lines NWL, and a ground selection line GSL. The string selection line SSL, the dummy word lines DWL, the normal word lines NWL, and the ground selection line GSL are respectively connected to a string selection transistor SST, dummy cells DC, normal cells NC, and a ground selection transistor GST of each cell string CST. For the sake of convenience, the transistors and cells corresponding to the layers, respectively, are not illustrated.

Figure 6:
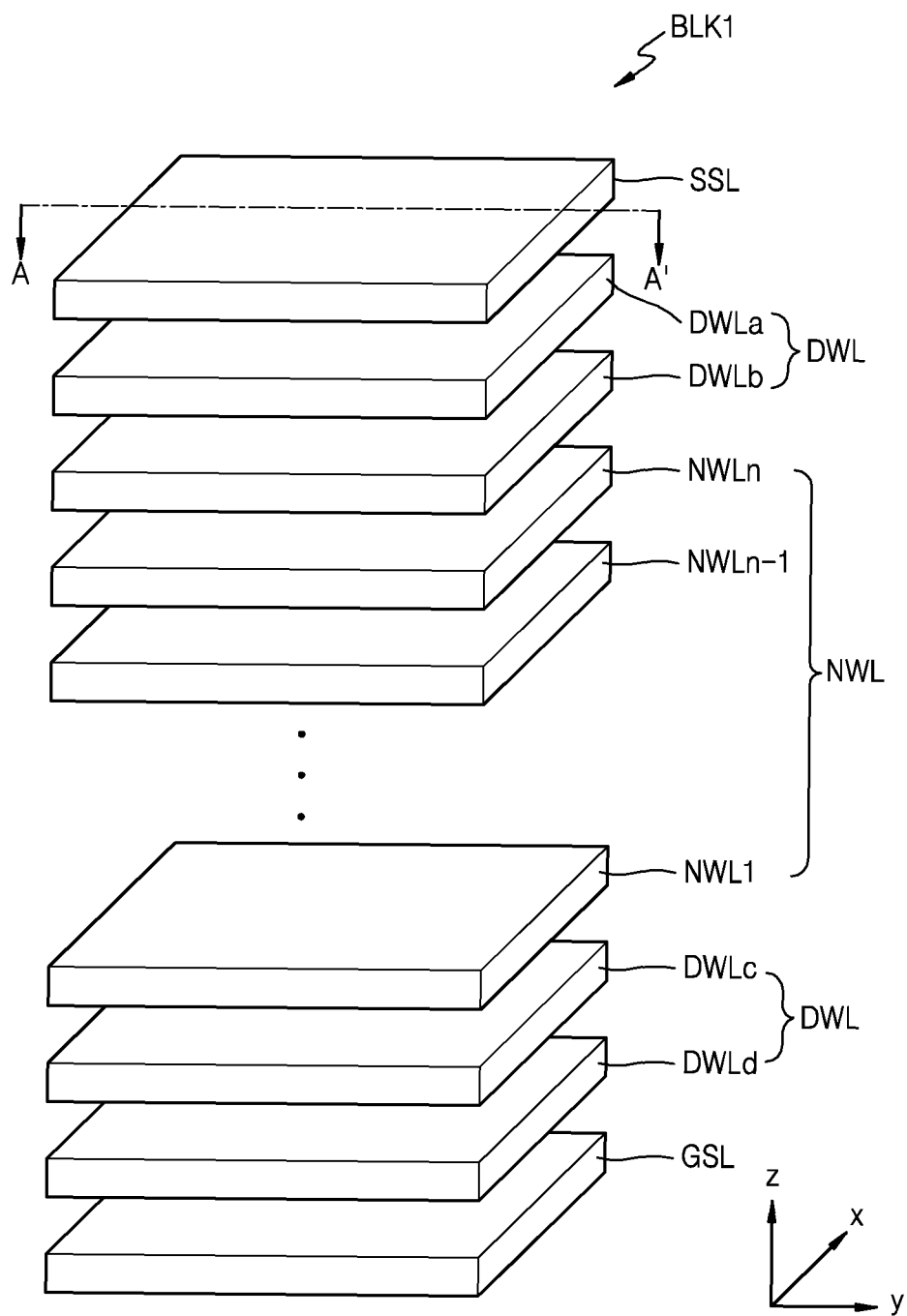

As illustrated in FIG. 5, the dummy word lines DWL may be implemented by two layers DWLa and DWLb adjacent to the string selection line SSL. Furthermore, referring to FIG. 6, which illustrates another example of the first memory block BLK1, dummy word lines DWL may be implemented by two layers DWLa and DWLb adjacent to the string selection line SSL and two layers DWLc and DWLd adjacent to the ground selection line GSL. However, embodiments of the inventive concept are not limited to these configurations of dummy word lines DWL. The dummy word lines DWL may be implemented by lines that are respectively adjacent to the string selection line SSL and the ground selection line GSL. The layers indicated as dummy cells DC or the dummy word lines DWL may be provided in order to minimize undesired influences of voltages applied to the string selection line SSL, the dummy word lines DWL, the normal word lines NWL, and the ground selection line GSL have on a cell string CST during an operation of the non-volatile memory device 200.

Figure 7:
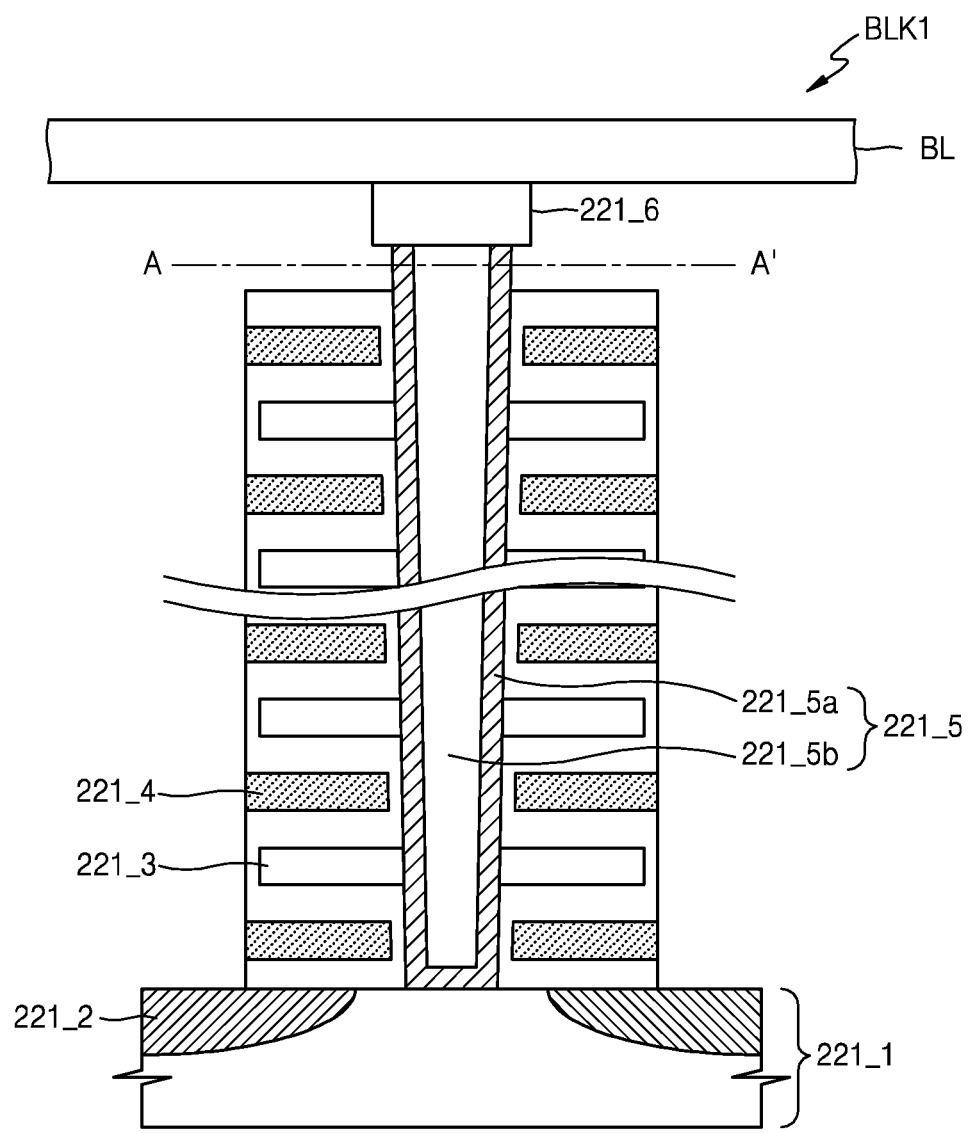

FIG. 7 is a cross-sectional view taken along the line A-A' of the memory cell array 221 of FIG. 5. Referring to FIG. 7, substrate 221_1 has a first type conductivity, and a well 221_2 has a second type conductivity that is different from the first type conductivity. The first type conductivity may be a p-type and the second type conductivity may be an n-type. However, embodiments of the inventive concept are not limited thereto. Alternately stacked insulating patterns 221_3 and conductive patterns 221_4 are formed above between a pair of adjacent wells 221_2. The insulating patterns 221_3 may be silicon oxides and the conductive patterns 221_4 may be polysilicon, for example. Also, the insulating patterns 221_3 and the conductive patterns 221_4 may be formed by chemical vapor deposition (CVD), for example. Gates of the above-described string selection transistor SST, dummy cells DC, normal cells NC, and ground selection transistor GST may be implemented by the conductive patterns 221_4.

A channel structure 221_5 for connecting the substrate 221_1 and a contact plug 221_6 (drain) may be formed between two structures in which the insulating patterns 221_3 and the conductive patterns 221_4 are alternately stacked. The channel structure 221_5 includes a pillar 221_5a and a channel region 221_5b. The pillar 221_5a of the channel structure 221_5 may be formed of an insulating material.

The string selection transistor SST, the dummy cells DC, the normal cells NC, and the ground selection transistor GST included in the cell string CST may share the same channel. As illustrated in FIG. 7, the channel structure 221_5 extends in the direction Z vertical to the substrate 221_1. The channel structure 221_5 may have a channel last structure (for example, a bit-cost scalable (BiCS) structure) in which the channel structure 221_5 is formed after the conductive patterns 221_4 are formed, or a channel first structure (for example, a terabit cell array transistor (TCAT) structure) in which the conductive patterns 221_4 are formed after the channel structure 221_5 is formed.

Figure 8A:
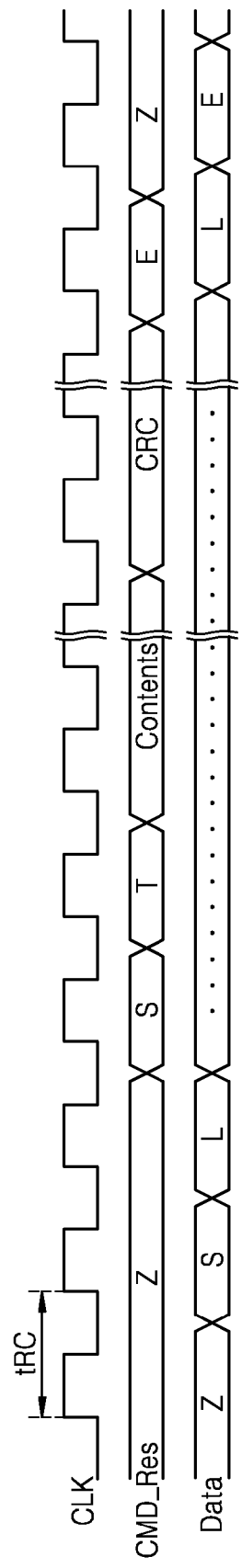
FIG. 8A is a timing diagram of a command response in an HS400 mode in conventional art.
Figure 8B:
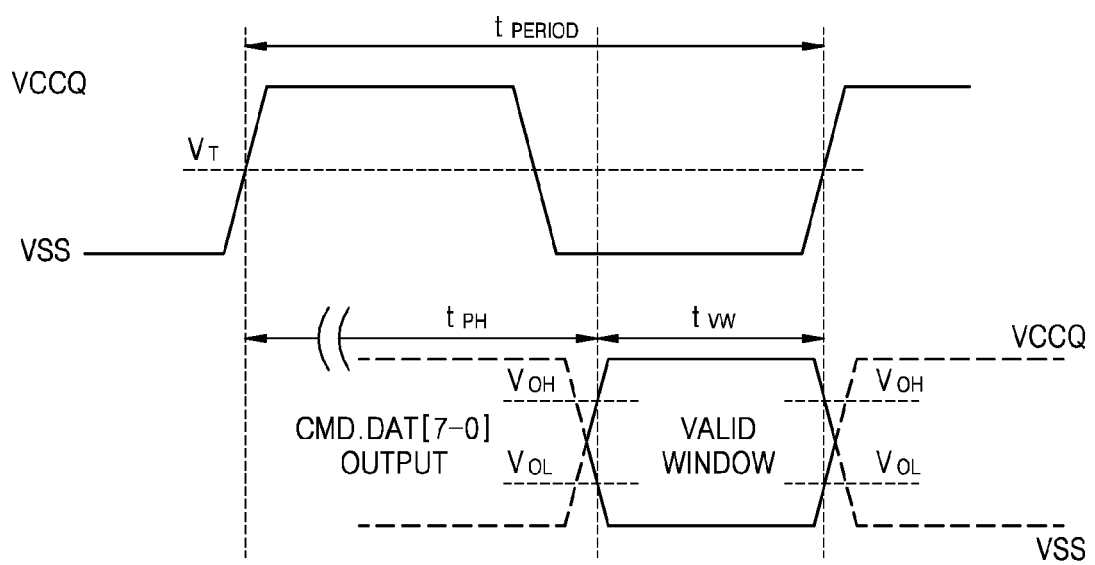
FIG. 8B is a view illustrating a valid window characteristic in an HS200 mode in conventional art.

FIGS. 8A and 8B are timing diagrams of a command response in an HS400 mode and a view illustrating a valid window characteristic in an HS200 mode in conventional art. As illustrated in FIG. 8A, the clock signal CLK may be provided from the host to the non-volatile memory system with a predetermined period tRC. In addition, the command response CMD_Res may be provided to the host in response to the command CMD from the host. For example, the command response CMD_Res may include a start bit S, response data Contents, a CRC code CRC, and an end bit E. Data corresponding to the command CMD may be provided to the host 100.

As illustrated in FIG. 8A, the command response in the HS400 mode has the same timing as that in the HS200 mode. Notably, timing of the command CMD or the command response CMD_Res may be transmitted by a single data rate (SDR) method, and the strobe signal Sig_ss is not applied when the command response CMD_Res is output. Therefore, since the strobe signal Sig_ss is not be used during the command response CMD_Res, it is difficult to secure the valid window of the command response CMD_Res. In addition, it is therefore difficult to increase speed of the command response CMD_Res, and thus overall operation speed of the non-volatile memory system is limited.

FIG. 8B is the view illustrating a valid window characteristic of output timing in the HS200 mode. Since output timing of the command CMD or the data is described based on a valid window Tvw of a user interface (UI) base, the point of time at which valid data is output is not correctly identified. Therefore, a sequence for searching for a point of time at which valid data is output is required. In addition, since the point of time at which valid data is output may vary in accordance with an operation condition, a point of time at which correct data is output must be searched for every time, generating overhead. In addition, a valid data window may be defined as 57.5 percent based on the clock signal CLK, so that there are limitations on increasing the overall operation speed of the non-volatile memory system 200.

Figure 9:
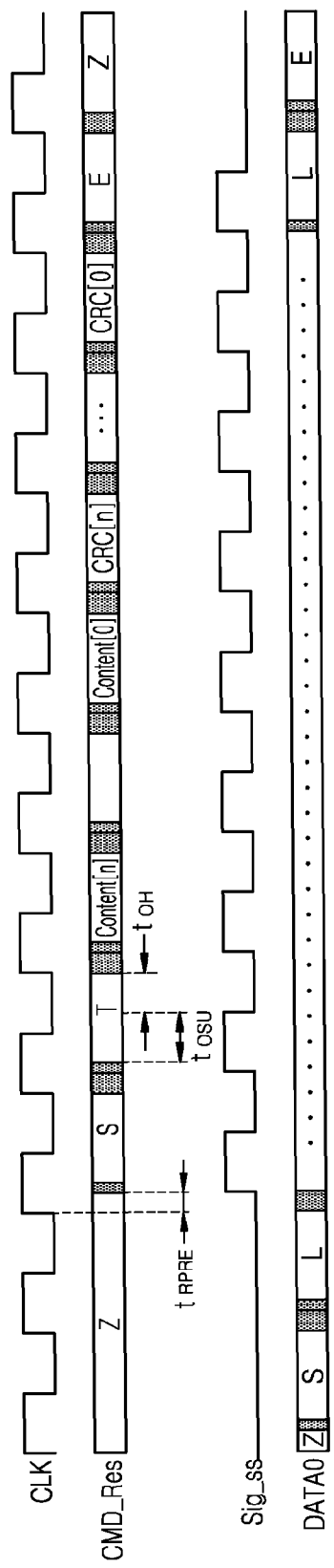
FIG. 9 is a timing diagram of a command response, according to an embodiment of the inventive concept.

FIG. 9 is a timing diagram of a command response, according to an embodiment of the inventive concept.

As illustrated in FIG. 9, the non-volatile memory system 200 receives the clock signal CLK from the host 100, and generates the command response CMD_Res corresponding to the command CMD from the host 100. As described above, the command response CMD_Res may include the start bit S, the response data Contents, the CRC code CRC, and the end bit E. While the command response CMD_Res is provided, the strobe signal Sig_ss is activated and provided to the host 100. In addition, the data Data may be written in or read from the non-volatile memory system 200 in response to the command CMD from the host 100.

In accordance with waveforms related to the memory operation illustrated in FIG. 9, the non-volatile memory system 200 provides the strobe signal Sig_ss for reading the command response CMD_Res to the host 100 as a reference signal together with the command response CMD_Res corresponding to the command CMD so that the host 100 stably stores the command response CMD_Res. In addition, as in the above-described embodiments, the non-volatile memory system 200 generates the strobe signal Sig_ss that is synchronized with the command response CMD_Res using the clock signal CLK input from the host 100, and retransmits the generated strobe signal Sig_ss to the host 100. Therefore, the host 100 is able to secure the valid window of the command response CMD_Res and use the strobe signal Sig_ss for latching the command response CMD_Res.

According to another embodiment, the strobe signal Sig_ss is generated in synchronization with the above-described command response CMD_Res using a data strobe signal used for transmitting and receiving the data Data in the HS400 mode of the non-volatile memory system 200. In this case, a signal with the same phase as that of the data strobe signal or a signal with a phase obtained by changing the phase of the data strobe signal may be generated as the strobe signal Sig_ss.

In addition, FIG. 9 illustrates an example in which a command response CMD_Res of one bit is transmitted in one period of the clock signal CLK by the SDR method. However, embodiments of the inventive concept are not limited thereto. For example, as the data is transmitted in the HS400 mode of the non-volatile memory system 200 by the DDR method, a command response CMD_Res of multiple bits may be transmitted to the host 100 in one period of the clock signal CLK. That is, in transmitting the command response CMD_Res and the strobe signal Sig_ss to the host 100, the command response CMD_Res in synchronization with a rising edge and a falling edge of the strobe signal Sig_ss may be transmitted to the host 100.

Figure 10:
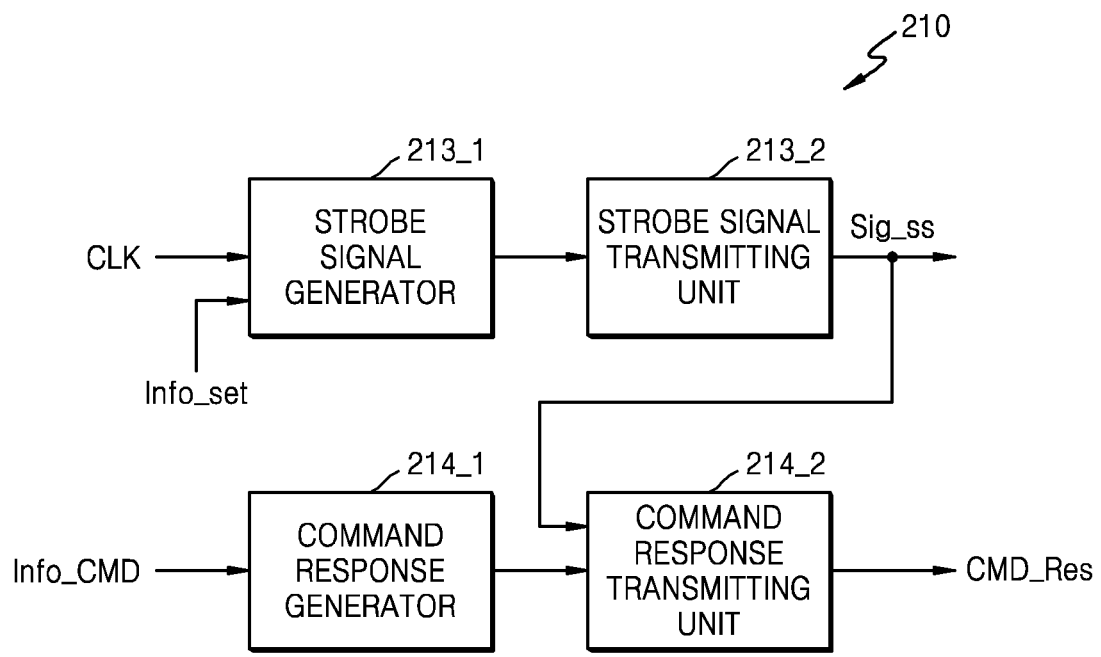
FIG. 10 is a block diagram of a memory controller in a non-volatile memory system generating a command response and a strobe signal, according to an embodiment of the inventive concept.

FIG. 10 is a block diagram of a memory controller in a non-volatile memory system generating a command response and a strobe signal, according to an embodiment of the inventive concept. FIG. 10 shows the memory controller 210 provided in the non-volatile memory system 200.

As illustrated in FIG. 10, the memory controller 210 includes a strobe signal generator 213_1 and a strobe signal transmitting unit 213_2. In addition, the memory controller 210 further includes a command response generator 214_1 and a command response transmitting unit 214_2. For example, the strobe signal generator 213_1 and the strobe signal transmitting unit 213_2 may be included in the strobe signal generator 213 of FIG. 2, and the command response generator 214_1 and the command response transmitting unit 214_2 may be included in the command transmitting and receiving unit 214 of FIG. 2.

The strobe signal generator 213_1 generates the strobe signal Sig_ss using the clock signal CLK and setting information Info_set. The clock signal CLK is provided from the host 100 and the setting information Info_set is previously set in relation to a delay between the clock signal CLK and the strobe signal Sig_ss. The strobe signal generator 213_1 delays the clock signal CLK based on the setting information Info_set to generate the strobe signal Sig_ss. The strobe signal transmitting unit 213_2 transmits the strobe signal Sig_ss to the host 100.

The command response generator 214_1 receives information Info_CMD related to processing of the command CMD from the host 100, and generates an internal command response CMD_int in response to the received information Info_CMD. As in the above-described embodiments, the non-volatile memory system 200 may generate information that represents whether the command CMD is normally received from the host 100 and/or whether the memory operation is normally performed in response to the command CMD. The generated information is provided to the command response generator 214_1 as the information Info_CMD related to processing of the command CMD. The command response transmitting unit 214_2 receives the internal command response and the strobe signal Sig_ss, and outputs the command response CMD_Res to the host 100 in synchronization with the strobe signal Sig_ss.

Figure 11:
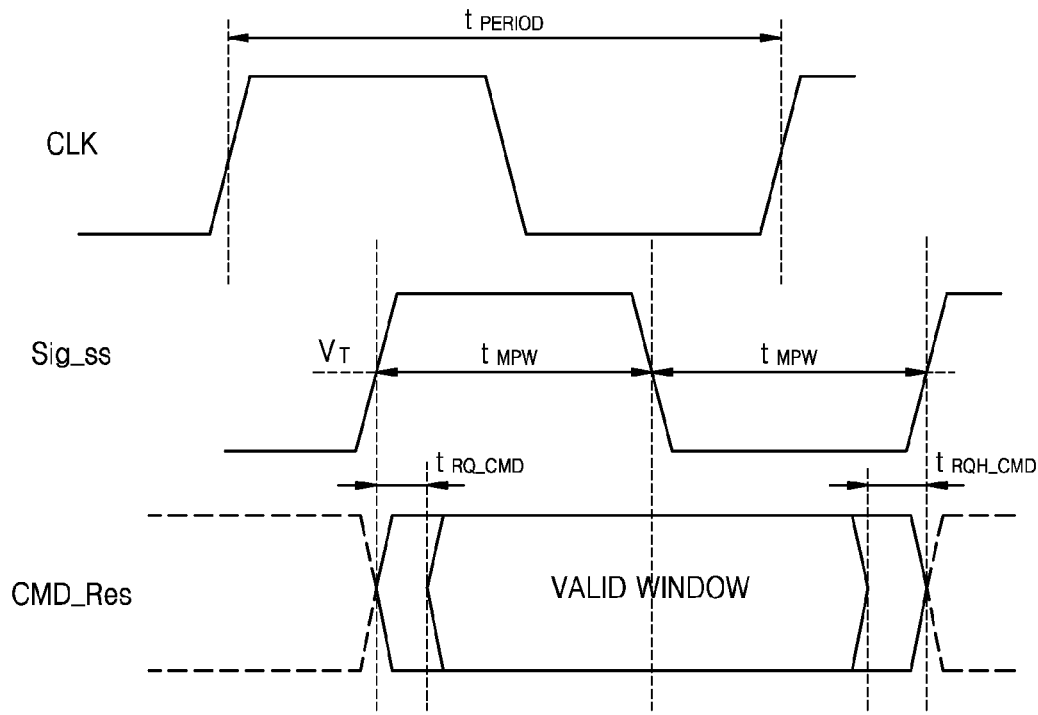
FIGS. 11 and 12 are timing diagrams illustrating examples of a method of synchronizing a command response and a strobe signal, according to embodiments of the inventive concept.
Figure 12:
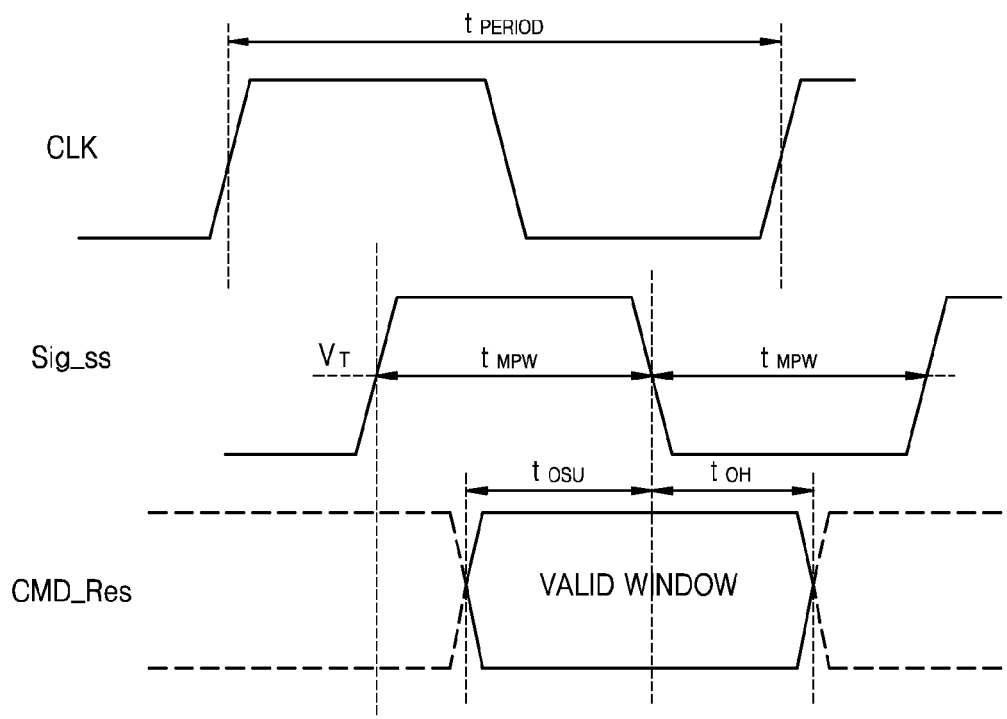

FIGS. 11 and 12 are timing diagrams illustrating examples of a method of synchronizing a command response and a strobe signal, according to embodiments of the inventive concept. The command response CMD_Res and the strobe signal Sig_ss may be synchronized by various definition methods. For example, in FIG. 11, a skew of a command transmission line is defined based on a first edge of the strobe signal Sig_ss for synchronizing the command response CMD_Res and the strobe signal Sig_ss. In FIG. 12, a setup time Tosu and a hold time Toh for the command transmission line are defined based on a second edge of the strobe signal Sig_ss for synchronizing the command response CMD_Res and the strobe signal Sig_ss.

The strobe signal Sig_ss is generated using the clock signal CLK. For example, a period of the strobe signal Sig_ss may be equal to a period of the clock signal CLK. In addition, the skew is defined based on a rising edge of the strobe signal Sig_ss so that the valid window of the data (or the command response CMD_Res) may be defined. For example, a skew at a start point of the command response CMD_Res may be defined as Trq_cmd and a skew at an end point of the command response CMD_Res may be defined as Trqh_cmd. The host 100 may latch the command response CMD_Res in response to the rising edge of the strobe signal Sig_ss in accordance with the defined values. That is, the host 100 may latch the command response CMD_Res in response to a specific edge of the strobe signal Sig_ss without searching for the valid window of the command response CMD_Res by using an additional tuning protocol and determining a point with a largest margin in the searched valid window to receive the command response CMD_Res, thereby improving reception accuracy.

As illustrated in FIG. 12, since the strobe signal Sig_ss is generated by using the clock signal CLK, and the setup time Tosu and the hold time Toh are defined based on a falling edge of the strobe signal Sig_ss, the valid window of the data (or the command response CMD_Res) may be defined in consideration of the setup time Tosu and the hold time Toh. Therefore, the host 100 may latch the command response CMD_Res in response to the falling edge of the strobe signal Sig_ss.

Figure 13:
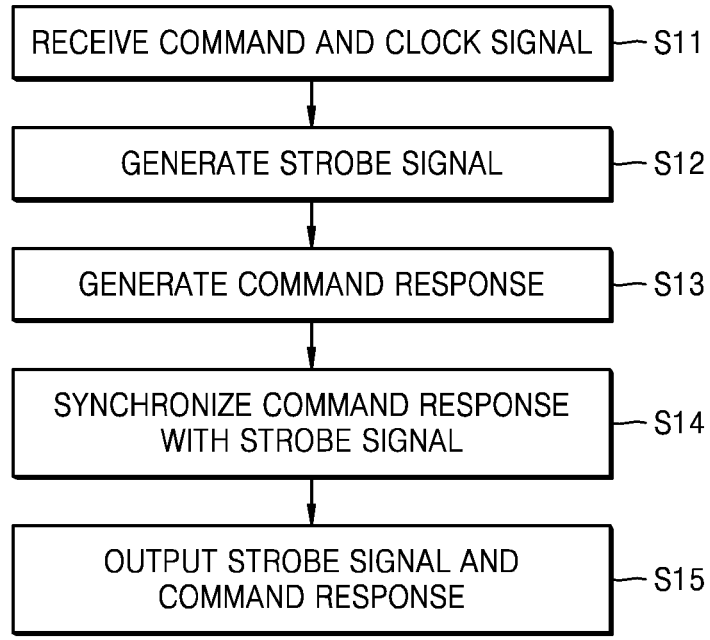
FIG. 13 is a flowchart of a method of operating the non-volatile memory system, according to an embodiment of the inventive concept.

FIG. 13 is a flowchart of a method of operating the non-volatile memory system 200, according to an embodiment of the inventive concept.

As illustrated in FIG. 13, the non-volatile memory system 200 receives the command CMD and the clock signal CLK from the host in operation S11 in order to perform a memory operation request from the host. That is, the non-volatile memory system 200 performs an operation corresponding to the memory operation request from the host 100 in response to the memory operation request from the host 100, and receives the command CMD and the clock signal CLK from the host 100 in order to perform the memory operation request.

The non-volatile memory system 200 receives various signals in synchronization with the clock signal CLK. For example, in addition to the command CMD, the non-volatile memory system 200 may further receive the address ADD and the data Data. The non-volatile memory system 200 generates the strobe signal Sig_ss using the clock signal CLK in operation S12, and generates the command response CMD_Res in accordance with the command CMD from the host 100 in operation S13.

The non-volatile memory system 200 synchronizes the strobe signal Sig_ss and the command response CMD_Res with each other in operation S14, and outputs the synchronized strobe signal Sig_ss and command response CMD_Res to the host 100 in operation S15. The host 100 therefore may latch the command response CMD_Res in synchronization with the strobe signal Sig_ss.

Figure 14:
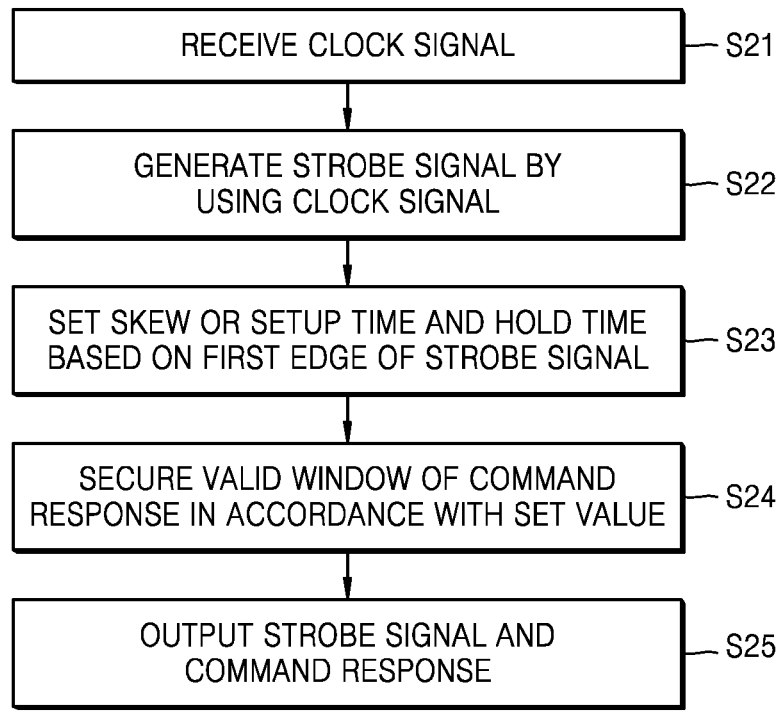
FIG. 14 is a flowchart of a method of operating the non-volatile memory system, according to another embodiment of the inventive concept.

FIG. 14 is a flowchart of a method of operating the non-volatile memory system 200, according to another embodiment of the inventive concept. FIG. 14 illustrates a detailed example in which the strobe signal Sig_ss and the command response CMD_Res are synchronized with each other.

As in the above-described embodiments, the non-volatile memory system 200 receives the clock signal CLK from the host 100 in operation S21, and generates the strobe signal Sig_ss using the clock signal CLK in operation S22. The strobe signal Sig_ss may be generated by controlling a phase of the clock signal CLK in accordance with previously set information, for example.

When the strobe signal Sig_ss is generated, the valid window of the command response CMD_Res is secured based on the strobe signal Sig_ss. That is, in operation S23, skew or setup time and hold time is set based on an edge(s) of the strobe signal Sig_ss. For example, the skew of the command transmission line may be defined based on the rising edge of the strobe signal Sig_ss, or the setup time Tosu and the hold time Toh of the command transmission line may be defined based on the falling edge of the strobe signal Sig_ss. That is, the skew may be defined based on a first edge of the strobe signal Sig_ss and the setup time Tosu and the hold time Toh may be defined based on a second edge of the strobe signal Sig_ss. The valid window of the command response CMD_Res is secured in accordance with the set values in operation S24, and the strobe signal Sig_ss and the command response CMD_Res, generated as described above, are output to the host 100 in operation S25.

Figure 15:
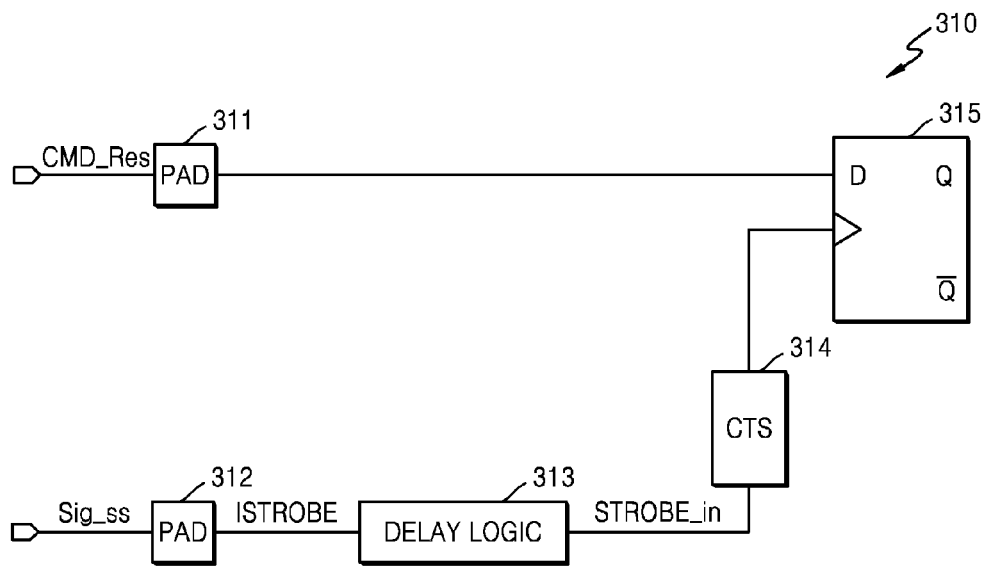
FIGS. 15 and 16 are block diagrams of a host receiving a command response, according to embodiments of the inventive concept.
Figure 16:
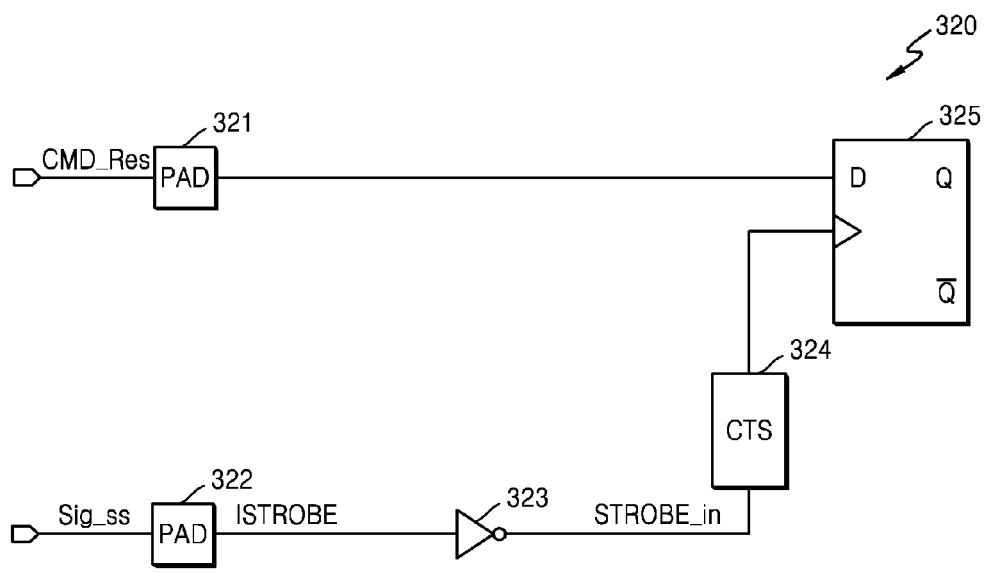

FIGS. 15 and 16 are block diagrams of a host receiving a command response, according to embodiments of the inventive concept. As illustrated in FIG. 15, host 310 includes a first pad 311 for receiving the command response CMD_Res, a second pad 312 for receiving the strobe signal Sig_ss, delay logic 313 for delaying an internal strobe signal ISTROBE, and a clock tree set CTS 314 for controlling phase of a delayed internal strobe signal STROBE_in in order to control skew between registers. The host 310 further includes a register 315 for storing the command response CMD_Res. The register 315 delays the strobe signal Sig_ss and stores the command response CMD_Res in response to an internal clock with a controlled phase.

The circuits illustrated in FIG. 15 are units for storing the command response CMD_Res of one bit. Multiple circuits may be provided in the host 310 in accordance with the number of bits of the command response CMD_Res. According to an embodiment of the inventive concept, when the host 310 stores the command response CMD_Res, since the start point of the valid window is defined, a tuning process of finding optimal latch timing may be omitted. That is, it is not necessary to provide an additional circuit for searching for a sampling point, as illustrated in FIG. 15, and a clock source of the register 315 for storing the command response CMD_Res may be used by applying a previously set delay value.

In comparison, when the valid window is defined, as illustrated in FIG. 12, a host 320 according to an embodiment of the inventive concept may be implemented by the circuit diagram of FIG. 16. As illustrated in FIG. 16, the host 320 includes a first pad 321 for receiving the command response CMD_Res, a second pad 322 for receiving the strobe signal Sig_ss, an inverter 323 for inverting a phase of the internal strobe signal ISTROBE, a clock tree set CTS 324 for controlling the phase of the delayed internal strobe signal STROBE_in in order to control skew between registers, and a register 325 for storing the command response CMD_Res.

In the host 320 illustrated in FIG. 16, the inverter 323 is used instead of the delay logic 313 of FIG. 15. According to the command response CMD_Res of FIG. 12, since the setup time Tosu and the hold time Toh of the command transmission line are defined based on the falling edge of the strobe signal Sig_ss, an internal clock ISTROBE_in with a changed phase may be generated by providing the internal strobe signal ISTROBE to the inverter 323, and the command response CMD_Res may be stored using the generated internal clock ISTROBE_in as the clock source. In FIGS. 15 and 16, the circuit for storing the command response CMD_Res is simplified, and thus a position, velocity, and time (PVT) change may be reduced. Therefore, the method is advantageous to securing the valid window and it is possible to store the command response CMD_Res at a high frequency.

Figure 17:
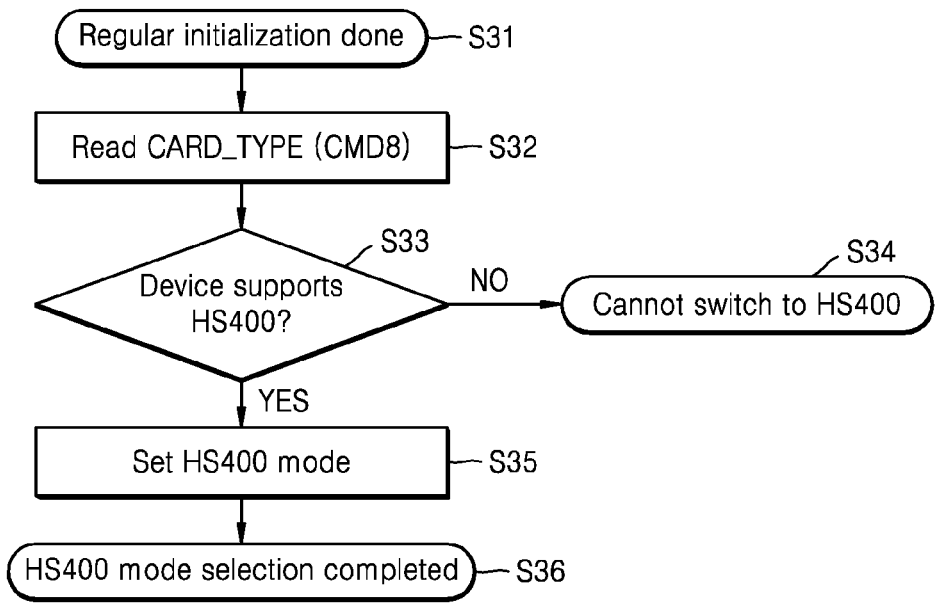
FIG. 17 is a flowchart of a method of operating a non-volatile memory system in an HS400 mode, according to an embodiment of the inventive concept.

FIG. 17 is a flowchart of a method of operating the non-volatile memory system 200 in an HS400 mode, according to an embodiment of the inventive concept.

As illustrated in FIG. 17, as the non-volatile memory system 200 is operated, a common initialization operation is performed in operation S31. Type information of a memory card included in the non-volatile memory system 200 is provided in response to a predetermined command CMD8 from a host in operation S32. For example, information that represents whether the corresponding memory card supports the HS200 mode or the HS400 mode may be read as the type information of the memory card.

It is determined whether the non-volatile memory system 200 supports the HS400 mode in accordance with the reading result in operation S33. When it is determined that the HS400 mode is not supported, switching to the HS400 mode is stopped in operation S34. When it is determined in operation S33 that the HS400 mode is supported, various information items for supporting the HS400 mode are set in operation S35, and an HS400 mode selection operation is completed in operation S36. As in the above-described embodiments, the additional tuning process of calculating the optimal timing for receiving the command response CMD_Res may be omitted.

In addition, since the tuning process related to reception of the command response CMD_Res is supported in the HS200 mode, in a conventional memory system, the HS200 mode must be supported in order to support the HS400 mode. However, according to the embodiment of the inventive concept, the non-volatile memory system 200 may be operated in the HS400 mode without supporting the HS200 mode.

Figure 18:
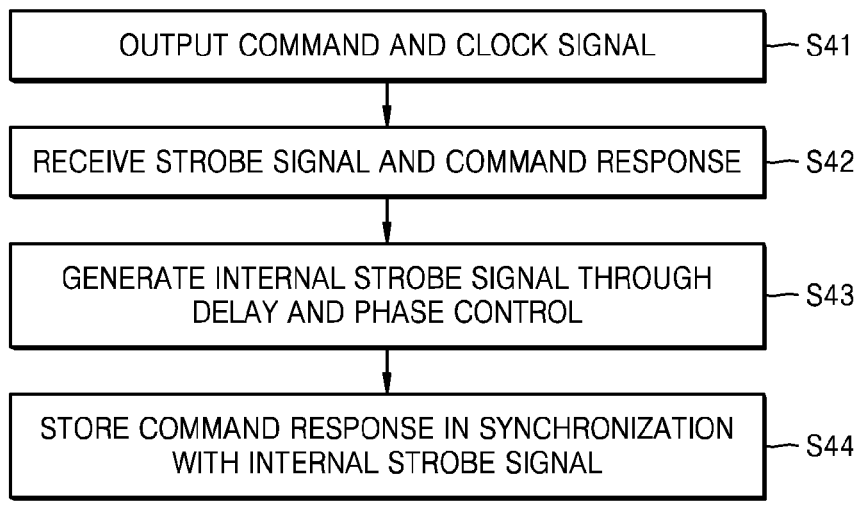
FIG. 18 is a flowchart of a method of operating a host, according to an embodiment of the inventive concept.

FIG. 18 is a flowchart of a method of operating a host, according to an embodiment of the inventive concept. As illustrated in FIG. 18, the host receives and stores the command response CMD_Res using the strobe signal Sig_ss from the non-volatile memory system 200 without the tuning process of controlling reception timing of the command response CMD_Res.

The host outputs the clock signal CLK and the command CMD to the non-volatile memory system 200 in operation S41, and receives the strobe signal Sig_ss and the command response CMD_Res from the non-volatile memory system 200 in operation S42. The strobe signal Sig_ss may be generated by the non-volatile memory system 200 by a method similar to or the same as those in the above-described embodiments.

The host may receive the strobe signal Sig_ss and the command response CMD_Res in parallel through additional pads and store the received command response CMD_Res in a register. In addition, the strobe signal Sig_ss may be used as the clock source of the register. For this purpose, the host delays the received strobe signal Sig_ss and controls a phase of the delayed strobe signal to generate an internal strobe signal in operation S43, and stores the command response CMD_Res using the generated internal strobe signal as the clock source (that is, in synchronization with the internal strobe signal) in operation S44.

Figure 19:
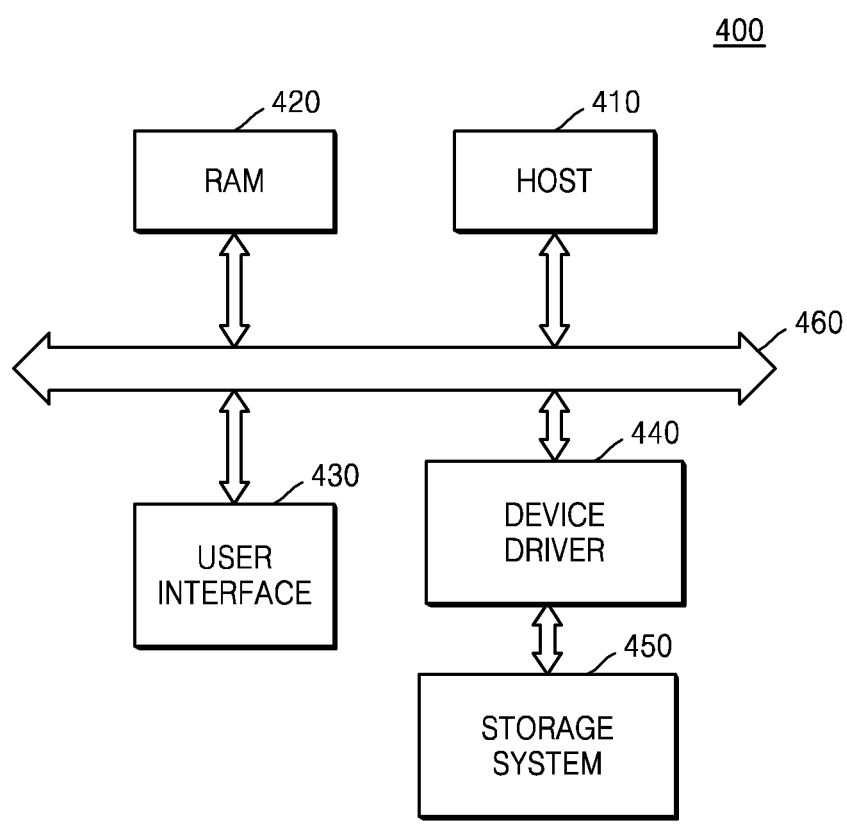
FIG. 19 is a block diagram of a computing system including a non-volatile memory system, according to an embodiment of the inventive concept.

FIG. 19 is a block diagram of a computing system including a non-volatile memory system, according to an embodiment of the inventive concept. Referring to FIG. 19, computing system 400 may be a mobile device or a desktop computer, for example. The non-volatile memory system according to an embodiment of inventive concept may be mounted as a non-volatile storage system 450 in the computing system 400.

The computing system 400 further includes a host 410 (with a central processing unit (CPU)), random access memory (RAM) 420, a user interface 430, and a device driver 440 that are electrically connected to each other via a bus 460. The non-volatile storage system 450 is connected to the device driver 440. The host 410 controls the computing system 400, and performs operations corresponding to commands input by a user through the user interface 430. The RAM 420 may function as a data memory of the host 410. The host 410 may write user data in or read user data from the non-volatile storage system 450 through the device driver 440. Although the device driver 440 for controlling operations of the non-volatile storage system 450 is illustrated as being outside the host 410, it is understood that the device driver 440 may be provided in the host 410, without departing from the scope of the present teachings.

As in the above-described embodiments, the command CMD and the command response CMD_Res may be transmitted or received between the host 410 and the non-volatile storage system 450. Also, the non-volatile storage system 450 may generate the strobe signal Sig_ss and provide the generated strobe signal Sig_ss to the host 410. The host 410 may receive the command response CMD_Res in synchronization with the strobe signal Sig_ss using the strobe signal Sig_ss and store the received command response CMD_Res.

Figure 20:
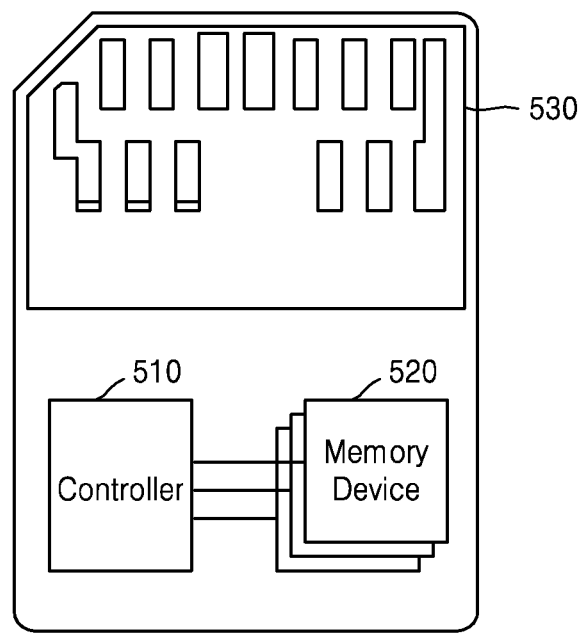
FIG. 20 is a block diagram illustrating a memory card, according to an embodiment of the inventive concept.

FIG. 20 is a block diagram illustrating a memory card, according to an embodiment of the inventive concept. Referring to FIG. 20, a memory card 500 may be a portable storage device connected to an electronic device, such as a mobile device or a desktop computer, for example. The memory card 500 includes a memory controller 510, a memory device 520 (e.g., a non-volatile cell array), and a port region 530.

The memory card 500 may communicate with an external host (not shown) through the port region 530. The memory controller 510 controls the non-volatile cell array 520. The memory controller 510 may read a program from read only memory (ROM) (not shown) for storing programs to execute the read program. The non-volatile cell array 520 may be operated according to embodiments of the inventive concept under control of the memory controller 510. The non-volatile cell array 520 may include a cell array such as a NAND flash memory and a NOR flash memory, for example.

In addition, as in the above-described embodiments, the memory controller 510 may generate the strobe signal Sig_ss using the clock signal CLK from the host, and may generate the strobe signal Sig_ss and the command response CMD_Res in synchronization with the strobe signal Sig_ss to provide the strobe signal Sig_ss and the command response CMD_Res to the host. In addition, the memory card 500 according to an embodiment of the inventive concept may support the HS200 mode and the HS400 mode, and the tuning process of setting the reception timing of the command response CMD_Res in each mode may be omitted.

Figure 21:
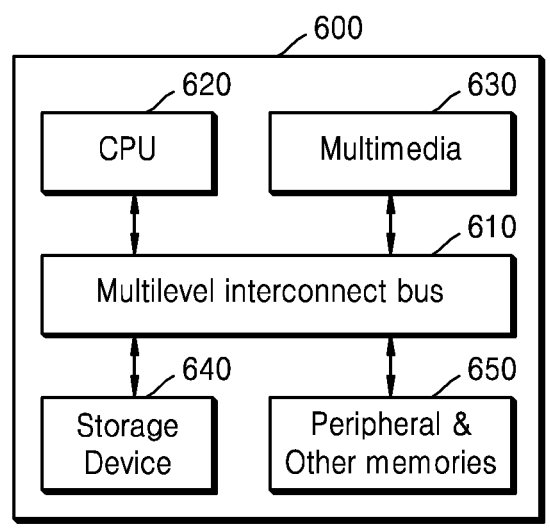
FIG. 21 is a block diagram of an application processor implemented by a host, according to an embodiment of the inventive concept.

FIG. 21 is a block diagram of an application processor implemented by a host, according to an embodiment of the inventive concept. Referring to FIG. 21, an application processor 600 may have various forms. For example, the application processor 600 may be implemented by an SoC. The SoC is implemented by integrating a system having various functions with one semiconductor chip. Multiple intellectual properties (IPs) may be integrated with the SoC. The IPs are implemented in the SoC to respectively perform specific functions.

The application processor 600 may include various IPs, for example, as illustrated in FIG. 21, a multi-level interconnect bus 610 as a system bus, a CPU 620 connected to the interconnect bus 610, a multimedia unit 630, a storage device 640 (such as a register), and a peripheral circuit 650 (including other memories). The storage device 640 may store the command response CMD_Res according to embodiments of the inventive concept.

The interconnect bus 610 may be implemented by applying a protocol with a predetermined standard bus specification. The standard bus specification may be the advanced microcontroller bus architecture (AMBA) protocol of the Advanced RISC Machine, for example. An advanced high-performance bus (AHB), an advanced peripheral bus (APB), an advanced extensible interface (AXI), AXI4, and AXI coherency extensions (ACE) may be included as bus types of the AMBA protocol, for example. Among the above-described bus types, AXI is an interface protocol between the IPs and provides a multiple outstanding address function and a data interleaving function. Other type protocols, such as uNetwork of SONICs Inc., CoreConnect of IBM, and an open core protocol of OCP_IP may be applied to the interconnect bus 610.

Alternatively, the various IPs illustrated in FIG. 21 may be implemented by function blocks that respectively perform unique operations. For example, the CPU 620 may correspond to a master IP and control overall operation of the application processor 600. In addition, the multimedia unit 630 may include a device for encoding an image and/or a device for decoding an image. In addition, the storage device 640 may include a unit for storing information (for example, information on the command response CMD_Res) provided by the non-volatile memory system that communicates with the application processor 600.

The application processor 600 may be mounted in each of various terminals such as the mobile device to function as a main processor. The peripheral circuit 650 may include a receiving device for receiving the strobe signal Sig_ss, as in the above-described embodiments. That is, the strobe signal received through the receiving device included in the peripheral circuit 650 may be provided to the storage device 640 through predetermined delay and phase control operations, and the storage device 640 may store the command response CMD_Res using the strobe signal Sig_ss as the clock source.

Figure 22:
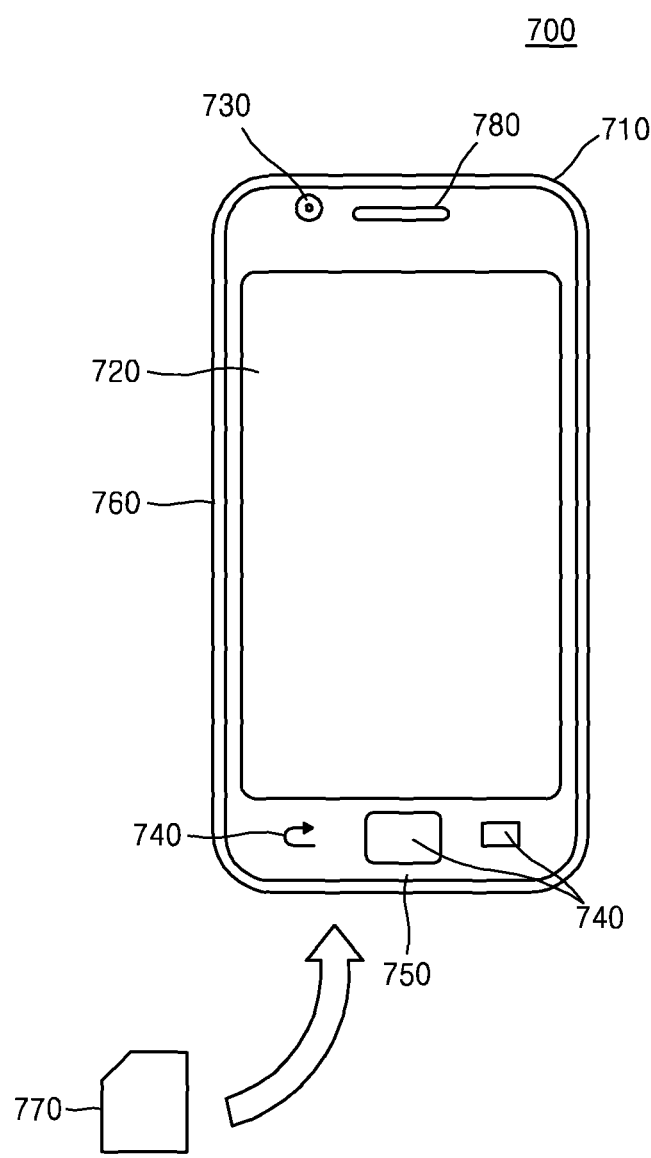
FIG. 22 is a perspective view of a mobile terminal mounted with a host and a non-volatile memory system, according to an embodiment of the inventive concept.

FIG. 22 is a perspective view of a mobile terminal having a host and a non-volatile memory system, according to an embodiment of the inventive concept. The mobile terminal 700 may be a smart phone, for example, the function of which is not limited and vary or extend through application programs. The mobile terminal 700 includes a built-in antenna 710 for exchanging a radio frequency (RF) signal with a wireless base station and a display screen 720, such as a liquid crystal display (LCD) screen and an organic light-emitting diode (OLED) screen, for displaying various images, including images captured by a camera 730 or images received by the built-in antenna 710 to be decoded. The mobile terminal 700 further includes an operation panel 740 including a control button and a touch panel. In addition, when the display screen 720 is a touch screen, the operation panel 740 may further include a touch sense panel of the display screen 720. The mobile terminal 700 includes a speaker 780 or another type sound output unit for outputting voice and sound, and a microphone 750 or another type sound input unit to which voice and sound are input. The mobile terminal 700 further includes the camera 730 such as a charge-coupled device (CCD) camera for capturing a video and a still image.

In addition, the mobile terminal 700 includes a storage medium 770 for storing encoded or decoded data together with videos or still images captured by the camera 730, received by an e-mail, or obtained through various other means, and a slot 760 for mounting the storage medium 770 in the mobile terminal 700. The storage medium 770 may be the non-volatile memory system 200 according to the above-described embodiments, for example, a flash memory such as an electrically erasable and programmable read only memory (EEPROM) mounted in an SD card or a plastic case.

While the inventive concept has been particularly described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:
1. A method of operating a non-volatile memory system, the method comprising:
   receiving a command;
   generating a strobe signal using a clock signal;
   generating a command response synchronized with the strobe signal and corresponding to the received command; and
   outputting the strobe signal and the command response.

2. The method of claim 1, wherein a first period during which the command response is output is set, and wherein the strobe signal is activated in the first period.

3. The method of claim 1, wherein the command response is synchronized with the strobe signal in accordance with a skew value defined based on a first edge of the strobe signal.

4. The method of claim 1, wherein the command response is synchronized with the strobe signal in accordance with a setup time and a hold time defined based on a second edge of the strobe signal.

5. The method of claim 1, wherein the strobe signal has a period equal to a period of the clock signal, and wherein the command response is output in synchronization with a first edge of the strobe signal.

6. The method of claim 1, wherein the strobe signal has a period equal a period of the clock signal, and wherein the command response is output in synchronization with first and second edges of the strobe signal.

7. The method of claim 1, wherein the clock signal is provided from an external host.

8. The method of claim 1, wherein the clock signal is a data strobe signal generated by the non-volatile memory system when data is output, and is provided externally from the non-volatile memory system together with the data.

9. A method of operating a host, the method comprising:
outputting a clock signal and a command;
receiving a command response corresponding to the command and a strobe signal in synchronization with the command response;
generating an internal strobe signal by performing at least one of delay and phase control operations on the strobe signal; and
storing the command response using the internal strobe signal as a clock source.

10. The method of claim 9, wherein a tuning process of determining a sampling point for latching the command response is omitted.

11. The method of claim 9, wherein the command response is received in response to rising and falling edges of the strobe signal.

12. The method of claim 9, wherein the strobe signal is delayed to generate the internal strobe signal when the command response is stored at a rising edge of the strobe signal, and
wherein a phase of the strobe signal is inverted to generate the internal strobe signal when the command response is stored at a falling edge of the strobe signal.

13. The method of claim 9, wherein the host is an application processor provided in a mobile device.

14. A non-volatile memory system with improved signal transmission and reception characteristics, the non-volatile memory system comprising:

a memory controller configured to receive a command and a clock signal related to a memory operation request from a host, to generate a strobe signal using the received clock signal, to generate a command response corresponding to the received command and synchronized with the strobe signal, to generate an internal command and an internal clock signal using the received command and clock signal, and to provide at least the command response and the strobe signal to the host; and a non-volatile memory device configured to receive the internal command and the internal clock signal generated by the memory controller, and to store write data in a memory cell array or provide read data to the memory controller, in response to the internal command.

15. The non-volatile memory system of claim 14, wherein the memory controller comprises:
a control unit configured to control operations related to at least one of writing data in the non-volatile memory device and reading data from the non-volatile memory device in response to the memory operation request from the host;
a clock signal receiving unit configured to receive the clock signal from the host and to generate the internal clock signal;
a command transmitting and receiving unit configured to receive the command from the host and to generate the command response corresponding to the command; and
a strobe signal generator configured to generate the strobe signal with which the command response is synchronized while the command response is output to the host.

16. The non-volatile memory system of claim 14, wherein the command response represents to the host at least one of whether the command is normally received by the memory controller or whether a memory operation corresponding to the memory operation request is normally performed in response to the command.

17. The non-volatile memory system of claim 14, wherein the non-volatile memory system comprises a flash memory.

18. The non-volatile memory system of claim 14, wherein the non-volatile memory system is a memory card.

19. The non-volatile memory system of claim 14, wherein the command response is synchronized with the strobe signal in accordance with a setup time and a hold time defined based on an edge of the strobe signal.

20. The non-volatile memory system of claim 14, wherein the strobe signal has a period equal to a period of the clock signal, and wherein the command response is output in synchronization with one of a first edge and a second edge of the strobe signal.

* * * * *